United States Patent
Gardner et al.

[11] Patent Number: 6,124,174
[45] Date of Patent: *Sep. 26, 2000

[54] SPACER STRUCTURE AS TRANSISTOR GATE

[75] Inventors: Mark I. Gardner, Cedar Creek; Thomas E. Spikes, Round Rock, both of Tex.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/857,628

[22] Filed: May 16, 1997

[51] Int. Cl.$^7$ ................................................ H01L 21/336
[52] U.S. Cl. .................... 438/303; 438/304; 438/305; 438/596
[58] Field of Search .................... 438/303, 304, 438/305, 306, 307, 286, 595, 596

[56] References Cited

U.S. PATENT DOCUMENTS

| | | | |
|---|---|---|---|
| 4,419,809 | 12/1983 | Riseman et al. | 29/571 |
| 4,442,589 | 4/1984 | Doo et al. | 29/571 |
| 4,460,413 | 7/1984 | Hirata et al. | 438/297 |
| 4,597,827 | 7/1986 | Nishitani et al. | 438/227 |
| 5,041,895 | 8/1991 | Contiero et al. | 257/374 |
| 5,202,272 | 4/1993 | Hsieh et al. | 438/395 |
| 5,283,449 | 2/1994 | Ooka | 257/204 |
| 5,373,476 | 12/1994 | Jeon | 365/226 |
| 5,445,107 | 8/1995 | Roth et al. | 438/481 |
| 5,468,666 | 11/1995 | Chapman | 437/44 |
| 5,576,570 | 11/1996 | Ohsawa et al. | 257/369 |
| 5,679,971 | 10/1997 | Tamba et al. | 257/357 |

FOREIGN PATENT DOCUMENTS

| | | |
|---|---|---|
| 0 186 058 | 7/1986 | European Pat. Off. . |
| 0 402 296 | 12/1990 | European Pat. Off. . |
| 0 675 544 A1 | 10/1995 | European Pat. Off. . |
| 60-66861 | 4/1985 | Japan . |

OTHER PUBLICATIONS

XP000671026 IBM Technical Disclosure, vol. 30, No. 3, Aug. 1987, pp. 1136–1137.
XP000120044 IBM Technical Disclosure, vol. 33, No. 1A, Jun. 1990, pp. 75–77.
International Search Report for PCT/US 98/06889 mailed Jul. 29, 1998.

Primary Examiner—Michael Trinh
Attorney, Agent, or Firm—Kevin L. Daffer; Conley, Rose & Tayon

[57] ABSTRACT

A semiconductor process includes forming a spacer support structure on an upper surface of a semiconductor substrate. The semiconductor substrate includes a channel region that is laterally displaced between first and second source/drain regions. A. The spacer support structure includes a substantially vertical sidewall that is laterally aligned over a boundary between the first source/drain region and the channel region of the semiconductor substrate. A gate dielectric is then grown and a transistor gate fabricated by forming a first spacer structure on the sidewall of the spacer support structure. The first spacer structure includes a substantially vertical first sidewall in contact with the spacer support structure sidewall and further includes a second sidewall that is laterally aligned over a boundary between the channel region and the second source/drain region of the semiconductor substrate. The spacer support structure is then removed and source/drain impurity distributions are introduced into the source/drain regions of the semiconductor substrate.

21 Claims, 2 Drawing Sheets

SPACER STRUCTURE AS TRANSISTOR GATE

BACKGROUND OF THE INVENTION

1. Field of the Invention

The present invention relates to the field of semiconductor processing and more particularly to a method of utilizing a spacer structure as a transistor gate to achieve an ultra short channel length.

2. Description of the Relevant Art

The operating characteristics of transistors fabricated with metal-oxide-semiconductor (MOS) integrated circuit techniques are a function of the transistor's dimensions. In particular, the source-to-drain current ($I_{ds}$) is proportional to the ratio of the transistor's width (W) to the transistor's length (L). For given transistor width and a given biasing condition (e.g., $V_G$=3V, $V_D$=3V, and $V_S$=0V), $I_{ds}$ is maximized by minimizing the transistor length L. Minimizing transistor channel length also improves the speed of integrated circuits comprised of a large number of individual transistors because the larger drain current associated with a short channel length can drive the adjoining transistors into saturation more quickly. Minimizing L is, therefore, desirable from an device operation standpoint. In addition, minimizing the transistor length L is desirable from a manufacturing perspective because a smaller area of silicon is required to manufacture a transistor having a smaller length. By minimizing the area required for a given transistor, the number of transistors available for a given area of silicon increases and with it, a corresponding increase in the circuit complexity that can be achieved on the given area of silicon.

The main limitation of minimum device size in a semiconductor process is the resolution of the optical lithography printing system. In an optical lithography printing system, radiation is directed from an illumination source through a patterned mask and onto a photoresist layer. The patterned mask transmits the illumination source radiation onto selected areas of the photoresist layer to reproduce the mask pattern in the photoresist layer. Resolution in optical lithography systems is limited by diffraction effects, which spread radiation from the illumination source into regions of the photoresist which are not directly exposed to the illumination source. Because of diffraction effects, there is a minimum distance beyond which even a geometrically perfect lens cannot resolve two points. In other words, when two points are less than a minimum distance from each other, the two points cannot be resolved by the lithography system. The diffraction patterns associated with each point overlap each other to such an extent that the two points cannot be effectively differentiated. The resolution of a lithography depends on the wavelength of the illumination source and the numerical aperture of the lens. Rayleighs criteria defines two images as being resolvable when the intensity between them drops to 80% of the image intensity. This criteria is satisfied when 2d=0.61λ/NA where 2d is the separation distance of two images, λ is the wavelength of the energy source, and NA is the numerical aperture of the lens.

Commercially available optical photolithography machines are typically equipped with mercury vapor lamps as the illumination source. The characteristic energy spectrum of a mercury vapor lamp contains several distinct peaks in the 300 nm to 450 nm wavelength range. These peaks are commonly referred to by their industry designations. The peak associated with a wavelength of ~450 nm is designated the "G-line," the ~405 nm peak the "H-line," and the ~370 nm peak the "I-line." Optical aligners are similarly designated such that it is common to speak of "G-line aligners." The minimum feature size resolvable by a G-line aligner is greater than the minimum feature size of an I-line aligner because of the longer G-line wavelength.

As process technologies approach and surpass the resolvable limits of G-line aligners, semiconductor manufacturers are forced to implement alternative photolithography techniques to achieve adequate resolution of the minimum features. Unfortunately, the conventional alternatives involve abandoning or substantially modifying the existing photolithography equipment at a prohibitive cost. Many wafer fabrication facilities, for example, have extensive capital investment in G-line and I-line aligners. To adequately resolve features in the submicron range, it is typically necessary to upgrade these aligners so that they can operate in the I-line or deep UV region or abandon the optical alignment equipment entirely and replace it with advanced lithography equipment including e-beam or x-ray lithography. The cost associated with replacing or upgrading photolithography equipment is typically enormous. In addition to the capital required to purchase and install the improved equipment, there are extensive costs associated with qualifying the new equipment for production worthiness and training production and maintenance personnel in the operation and care of the new equipment. Therefore, it is highly desirable to implement a semiconductor manufacturing process that is not dependent on photolithography equipment to define critical features of the integrated circuit.

SUMMARY OF THE INVENTION

The problems identified above are in large part addressed by a semiconductor process in which a spacer structure is used as a transistor gate to beneficially achieve an ultra short channel length. Using thin film spacer structure formation processes, gate structures with lateral dimensions (i.e., channel lengths) in the quarter micron region are achievable without regard to the available photolithography equipment.

Broadly speaking, the present invention contemplates a semiconductor process in which a spacer support structure is formed on an upper surface of a semiconductor substrate. The semiconductor substrate includes a channel region that is laterally displaced between first and second source/drain regions. The spacer support structure includes a substantially vertical sidewall that is laterally aligned over a boundary between the first source/drain region and the channel region of the semiconductor substrate. A transistor gate is then fabricated by forming a first spacer structure on the sidewall of the spacer support structure. The first spacer structure includes a substantially vertical first sidewall in contact with the spacer support structure sidewall and further includes a second sidewall that is laterally aligned over a boundary between the channel region and the second source/drain region of the semiconductor substrate. A first impurity distribution is introduced into the second source/drain region. The first impurity distribution is characterized by a first impurity depth and a first peak impurity concentration. The first spacer structure and the spacer support structure effectively prevent the first impurity distribution from entering the channel region and the first semiconductor substrate region. The spacer support structure is then removed to unmask the first semiconductor substrate region. A second impurity distribution is introduced into the first and second source/drain regions of the semiconductor substrate. The second impurity distribution has a second peak impurity concentration and a second impurity depth. The second peak impurity concentration is less than the first peak impurity concentration. A pair of second spacer structures is formed on the first and second sidewalls of the first spacer structure. The pair of second spacer structures masks portions of the source/drain regions proximal to the channel region. A third impurity distribution is then introduced into the semiconductor substrate. The presence of the first spacer structure and the pair of second spacer structures during the introduction of the third impurity distribution effectively prevents the third impurity distribution from entering the portions of the source/drain regions proximal to the channel region. The third impurity distribution has a third peak impurity concentration and a third impurity depth. The third peak impurity concentration is greater than the first and second peak impurity concentrations.

Preferably, the starting material for the semiconductor substrate is a silicon wafer. In an embodiment of the present invention useful in the formation of CMOS integrated circuits, the silicon wafer includes a p-type epitaxial layer formed on p+ silicon bulk. A preferred resistivity of the p-type epitaxial layer is in the range of approximately 10 to 15 $\Omega$-cm. The formation of the gate dielectric in a presently preferred embodiment is accomplished by growing a thermal oxide film by immersing the semiconductor substrate in an oxygen bearing ambient maintained at a temperature in the range of approximately 500° C. to 800° C. Preferably, the formation of the spacer support structure is accomplished by depositing a photoresist or oxide layer on an upper surface of the gate dielectric, and patterning the layer with photolithography and etch techniques. The preferred method of forming the first spacer structure includes depositing a first conformal film over a topography that includes upper surfaces of the semiconductor substrate and the patterned photoresist layer. The topography includes planar regions which are substantially parallel with the upper surface of the semiconductor substrate. Subsequent to the deposition process, the first conformal film is anisotropically etched for a duration sufficient to substantially remove the first conformal film from the planar regions of the topography without removing the first conformal film from the remaining portions of the topography. The preferred method of depositing the first conformal film includes thermally decomposing silane in a chemical vapor deposition reactor chamber maintained at a temperature in the range of approximately 580° C. to 650° C. and a pressure of less than approximately two torr. In one embodiment, an impurity concentration may be introduced into the polysilicon film to reduce a sheet resistivity of the polysilicon to less than approximately 500 $\Omega$/square. In another embodiment, the deposition of the first conformal film comprises depositing a conductive material such as silicon, aluminum, tungsten, copper, or an appropriate alloy thereof.

The introduction of the first impurity distribution in the preferred embodiment includes implanting ions of boron, arsenic, or phosphorous. A preferred implant energy used for the first impurity distribution is in the range of approximately 10 to 50 keV and an implant dose in the range of approximately $2 \times 10^{14}$ to $1 \times 10^{15}$ atoms/cm$^2$. The introduction of the second impurity distribution in the preferred embodiment is accomplished by implanting boron, phosphorous, or arsenic using an implant energy of approximately 10 to 50 keV and an implant dose of less than approximately $2 \times 10^{14}$ atoms/cm$^2$. The formation of the pair of second spacer structures is accomplished by depositing a second conformal film over the topography comprised of the semiconductor substrate and the first spacer structure. Like the first topography, this topography includes planar regions that are substantially parallel with the upper surface of the semiconductor substrate. Thereafter, the second conformal film is anisotropically etched for a duration sufficient to substantially remove the second conformal film from the planar regions of the topography without removing the film from the remaining portions of the topography. The deposition of the second conformal film is preferably accomplished with an oxide deposition process comprising by reacting oxygen and silicon in a chemical vapor deposition reactor chamber maintained at a temperature in the range of approximately 200° C. to 700° C. and a pressure of less than approximately 2 torr. The introduction of the third impurity distribution preferably comprises implanting ions of boron, phosphorous, or arsenic using an implant energy in the range of approximately 10 to 100 keV and an implant dose of greater than approximately $1 \times 10^{15}$ atoms/cm$^2$. In a presently preferred embodiment, the thickness of the first conformal film in the planar regions of the underlying topography is in the range of approximately 500 to 2000 angstroms such that a lateral dimension of the first spacer structure is in the range of approximately 400 to 2000 angstroms resulting in transistor channel length in approximately the same dimension.

The present invention still further contemplates a process for fabricating a semiconductor transistor comprised of a gate terminal and a first and second source/drain region. The first and second source/drain region are laterally displaced within a semiconductor substrate on either side of the channel of the semiconductor substrate. The process includes the steps of providing the semiconductor substrate, forming a spacer support structure on the semiconductor substrate, fabricating a gate terminal on an upper surface of the gate dielectric, forming a gate dielectric on an upper surface of the semiconductor substrate, and introducing impurity distributions into these source/drain regions. The fabrication of the gate terminal is accomplished by forming a spacer structure on a sidewall of a spacer support structure such that the gate tunnel is aligned over a channel region of the semiconductor substrate.

Preferably, the formation of the gate dielectric is accomplished by growing a thermal oxide film on an upper surface of the semiconductor substrate by immersing the substrate in an oxygen bearing ambient maintained at a temperature in the range of approximately 500° C. to 800° C. The formation of the spacer structure includes patterning a layer of photoresist or oxide to form a pattern layer which includes the spacer support structure. The formation of the spacer structure comprises depositing a conformal film over a topography and anisotropically etching the conformal film. The topography includes upper surfaces of the semiconductor substrate and the patterned photoresist layer. The topography includes planar regions that are substantially parallel with the upper surface of the semiconductor substrate. The anisotropic etch of the conformal film continues for a duration sufficient to substantially remove the conformal film from the planar regions of the topography without removing the conformal film from remaining portions of the topography.

The present invention still further contemplates a semiconductor transistor. The transistor includes a semiconductor substrate, a gate dielectric formed on an upper surface of the semiconductor substrate, a gate terminal formed on an upper surface of the gate dielectric, and a source and a drain impurity distribution located within respective source/drain regions of the semiconductor substrate. The gate terminal is aligned over a channel region of the semiconductor substrate and comprises a spacer structure. The source and drain regions are laterally displaced on either side of the channel region.

Preferably, the substrate comprises silicon and the gate dielectric comprises a thermal oxide. The spacer structure preferably comprises a conductive material such as heavily doped silicon, aluminum, tungsten, copper, or an appropriate alloy thereof. A lateral dimension of the spacer structure and a lateral dimension of the channel region of the transistor is in the range of approximately 400 to 2000 angstroms in the presently preferred embodiment.

BRIEF DESCRIPTION OF THE DRAWINGS

Other objects and advantages of the invention will become apparent upon reading the following detailed description and upon reference to the accompanying drawings in which.

Figure 1:
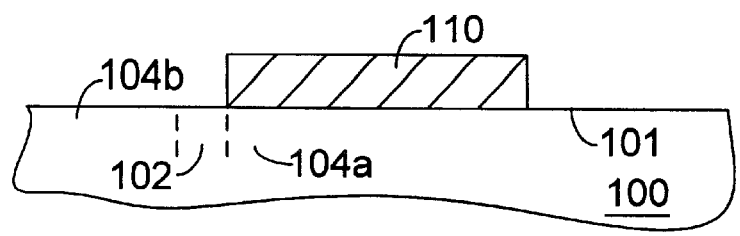
FIG. 1 is a partial cross-sectional view of a semiconductor substrate on which a spacer support structure has been formed.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Turning now the drawings, FIGS. 1 through 5 show a processing sequence in accordance with the present invention for fabricating a semiconductor transistor. In FIG. 1, semiconductor substrate 100 is shown with a spacer support structure 110 formed on upper surface 101 of semiconductor substrate 100. Semiconductor substrate 100 suitably includes a silicon semiconductor wafer as is well known in the field of semiconductor processing. In a presently preferred embodiment useful in the fabrication of CMOS integrated circuits, semiconductor substrate includes a p-type epitaxial layer formed on an upper surface of a p+ silicon bulk (not shown in the drawing). A preferred resistivity of the p-type epitaxial layer in this embodiment is in the range of approximately 10 to 15 Ω-cm. Semiconductor substrate 100 includes a channel region 102 laterally displaced between a pair of source/drain regions represented in FIG. 1 as reference numerals 104b and 104a. Spacer support structure 110 comprises a disposable material that will eventually be discarded. The purpose of spacer support structure 110 is to provide a vertical support upon which a spacer structure may be subsequently formed. In one embodiment preferred for its simplicity, spacer support structure 110 is suitably fabricated of conventional photoresist. In this embodiment, photoresist is spun and deposited on gate dielectric 106 exposed to optical energy using an optical aligner and a photomask, and thereafter immersed or otherwise subjected to a developer solution all as are well known in the field of semiconductor processing and photolithography. In another embodiment useful in conjunction with processes that require a relatively high temperature during the subsequent spacer formation process, spacer support structure 110 comprises a dielectric such as CVD oxide. If, for example, the spacer structure described below is to be comprised of polysilicon (which requires a deposition temperature in excess of 500° C.), photoresist is unsuitable as spacer support structure 110 and a dielectric such as CVD oxide is preferred. Spacer support structure 110 includes a substantially vertical sidewall 112 that is aligned over a boundary 120 between channel region 102 and first source or drain region 104a.

Figure 2:
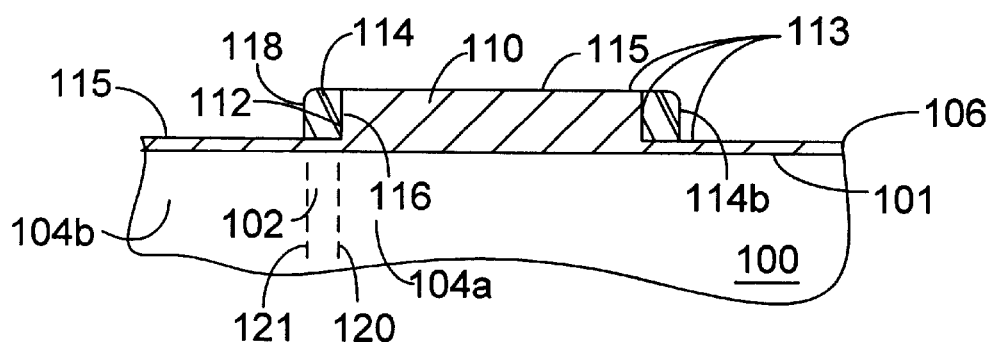
FIG. 2 is a processing step subsequent to FIG. 1 in which a gate dielectric has been grown and a spacer structure formed on a sidewall of the spacer support structure such that the spacer structure is aligned over a channel region of the semiconductor substrate.

Turning now to FIG. 2, a gate dielectric layer 106 is fabricated on an upper surface of semiconductor substrate 100. The fabrication of gate dielectric 106 may be achieved in a preferred embodiment with a thermal oxidation process during which semiconductor substrate 100 is immersed in an oxygen bearing ambient maintained at a temperature in the range of approximately 500° C. to 800° C. In an alternative embodiment, gate dielectric 106 may be deposited in a chemical vapor deposition reactor chamber. A thickness of gate dielectric 106 in a preferred embodiment is in the range of approximately 20 to 100 angstroms. (Because the thickness of gate dielectric 106 is typically insignificant in comparison to a thickness of spacer support structure 110, the additional oxide formed on an upper surface of spacer support structure 110 by the growth of gate dielectric 106 is not indicated in FIG. 2). In an embodiment in which spacer support structure 110 comprises photoresist, the gate dielectric 106 may be suitably grown prior to the formation of spacer support structure 110. Subsequent to the formation of gate dielectric layer 106, the transistor gate of the contemplated transistor is fabricated by forming a first spacer structure 114 on sidewall 112 of spacer support structure 110. First spacer structure 114 includes a substantially vertical first sidewall 116 in contact with sidewall 112 of the spacer support structure. First spacer structure further includes a second sidewall 118. Second sidewall 118 of first spacer structure 114 is laterally displaced from first sidewall 116 such that second sidewall 118 is aligned over a boundary 121 between channel region 102 and second source/drain region 104b of semiconductor substrate 100. Because first spacer structure 114 will serve as the gate terminal of the contemplated transistor, first spacer structure 114 suitably comprises a conductive material such as heavily doped silicon (i.e., silicon having a sheet resistivity of less than approximately 500 Ω/square), aluminum, copper, tungsten, or other suitable conductive material or alloy thereof.

The formation of first spacer structure 114 preferably includes the steps of depositing a first conformal film over a topography 113 which includes upper surfaces 101 of semiconductor substrate and an upper surface of the spacer support structure 110. Topography 113 includes planar regions represented in FIG. 2 as reference numeral 115. Planar regions, for purposes of this disclosure, refer to regions of topography 113 that are substantially parallel with upper surface 101 of semiconductor substrate 100. After the deposition of the first conformal film, the film is anisotropically etched for a duration sufficient to substantially remove portions of the first conformal film from planar region 115 of topography 113 without removing the first conformal film from the remaining portions of topography 113. The selective removal of portions of a conformal film can be accomplished by minimizing the overetch cycle of the anisotropic etch process. In one embodiment, for example, the overetch cycle of the anisotropic etch process used to produce the spacer structures is typically less than 10% of the main etch cycle.

In an embodiment of the present invention in which first spacer structure 114 comprises polysilicon, a preferred spacer formation process includes the step of depositing polysilicon by thermally decomposing silane in a chemical vapor deposition reactor chamber maintained at a temperature in the range of approximately 580° C. to 650° C. at a pressure of less than approximately 2 torr. In this embodiment, the sheet resistivity of the deposited polysilicon is preferably reduced by introducing an impurity distribution into the polysilicon suitably through an ion implantation process using a dose sufficient to reduce the sheet resistivity of the polysilicon to less than approximately 500 $\Omega$/square.

It will be appreciated to those skilled in the art that a symmetry exists in the preferred processing sequence that permits the simultaneous fabrication of a pair of transistors using a single spacer support structure. FIG. 2 shows a second gate structure 114b fabricated on a second substantially vertical sidewall 112b of spacer support structure 110. The remainder of the disclosure will focus on the fabrication of the first transistor although it is to be understood that no additional processing overhead is incurred by fabricating the second transistor simultaneously. It is further believed that the disclosure of the method for forming the first transistor encompasses the method for simultaneously forming the pair of transistors.

Figure 3:
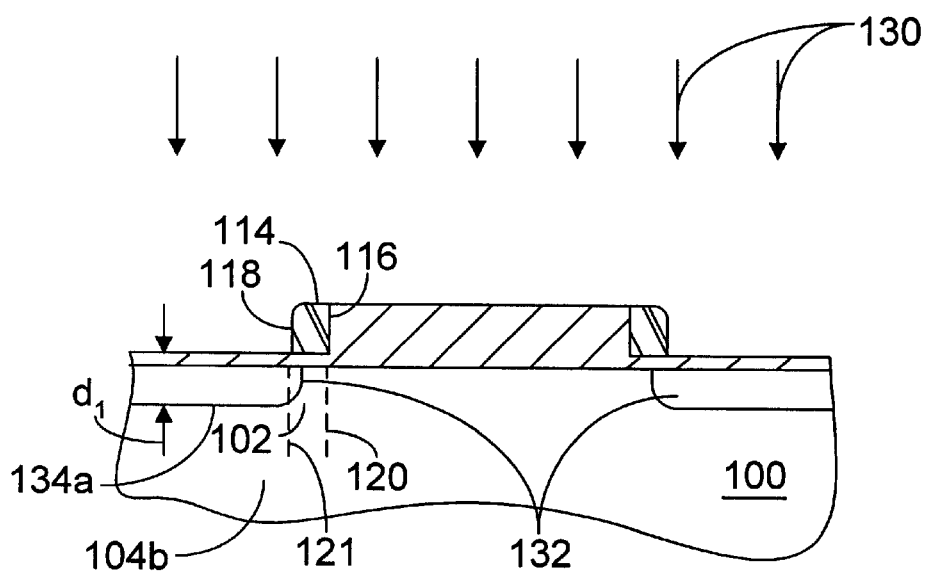
FIG. 3 is a processing step subsequent to FIG. 4 in which a first impurity distribution introduced into the second semiconductor substrate region of the semiconductor substrate.
Figure 4:
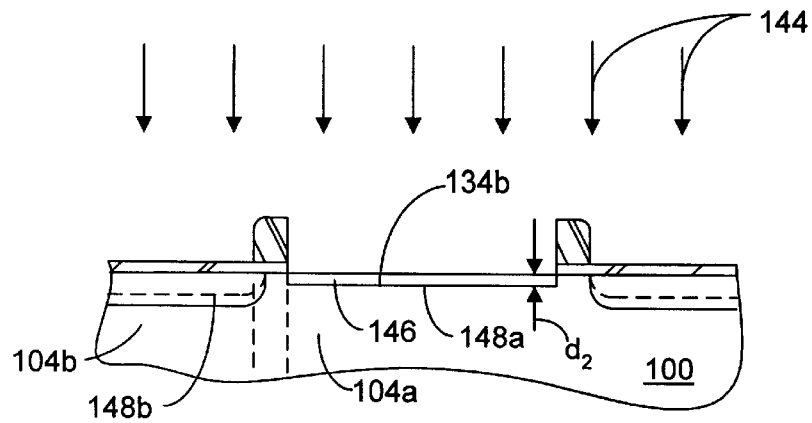
FIG. 4 is a processing step subsequent to FIG. 3 in which the spacer support structure has been removed and a second impurity distribution introduced into the first and second semiconductor substrate regions of the semiconductor substrate.
Figure 5:
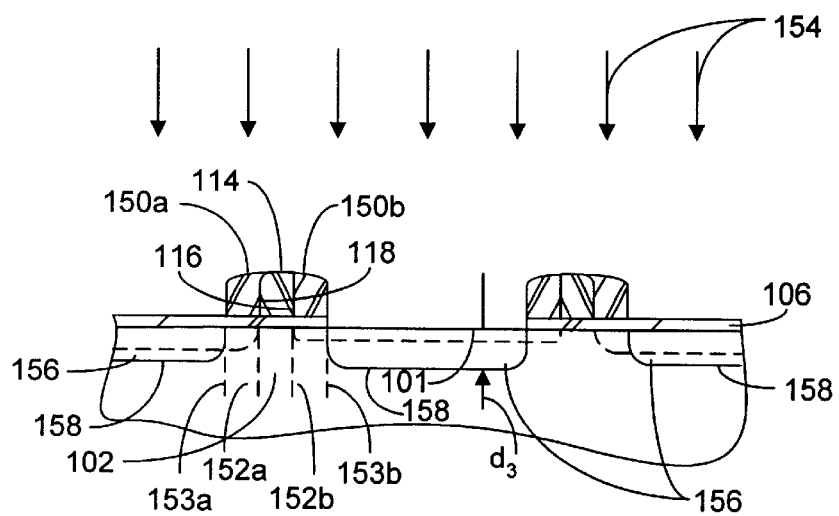
FIG. 5 is a processing step subsequent to FIG. 4 in which a pair of second spacer structures are formed on the sidewalls of the first spacer structure and a third impurity distribution introduced into the exposed portions of the semiconductor substrate.

Turning now to FIG. 3, a first impurity distribution 132 is introduced into semiconductor substrate 100. FIGS. 3 through 5 disclose a sequence of introducing three distinct source/drain impurity distributions into semiconductor substrate 100. In the depicted embodiment, the first impurity distribution comprises an intermediate impurity concentration that is selectively introduced into the source region of the semiconductor transistor on the assumption that the source region of each transistor is typically grounded in normal circuit operation and therefore will not significantly benefit from the inclusion of a lightly doped impurity distribution as shown and described with respect to FIG. 4. The second impurity distribution is a lightly doped drain (LDD) impurity distribution useful in short channel transistors (i.e., transistors having a channel length of less than approximately 0.5 microns) for reducing the maximum electric field occurring within the channel region thereby beneficially reducing occurrence of hot electron injection which may undesirably reduce the reliability of the gate dielectric 106. Finally, the third impurity distribution shown in FIG. 5 comprises a heavily doped source/drain impurity distribution useful for fabricating a highly conductive source/drain region to provide a plentiful source of carriers and to provide a region to which good ohmic contacts may be made with subsequent processing levels. Although the depicted embodiment encompasses these three distinct impurity distributions, it will be appreciated that the particulars of the impurity distribution within the source/drain regions of the transistor is not the primary emphasis of the present application and that simpler source/drain schemes such as a standard LDD type for both source and drain may be suitably employed. Instead, the present invention is primarily directed at the formation of a gate structure which has a critical dimension that is not defined by a photolithography process. By freeing the gate dimension from the limitations of photolithography resolution, the present invention beneficially provides a method for achieving smaller devices without requiring an upgrade or replacement of the photolithography apparatus.

Returning now to FIG. 3, first impurity distribution 132 is introduced into second semiconductor substrate region 104b of semiconductor substrate 100 in the preferred embodiment through first ion implantation 130. As mentioned previously, first impurity distribution 132 is designated in the presently preferred embodiment as an intermediate impurity distribution. Under the assumption that the source regions are typically grounded in normal circuit operation, the benefits achieved by implementing the source region with a lightly doped impurity distribution such as the distribution described with respect to FIG. 4 below are typically outweighed by the higher resistance of the lightly doped drain region. Accordingly, the presently preferred embodiment shows a first impurity distribution 132 selectively introduced into first impurity region 134 which extends within second source/drain region 104b but not within first source/drain region 104a. Accordingly, a suitable dose for first ion implantation 130 is in the range of approximately $2 \times 10^{14}$ to $1 \times 10^{15}$ atoms/cm$^2$. Suitable impurity species include the species commonly associated with source/drain impurity distributions such as phosphorous, arsenic, or boron. First impurity region 134 extends vertically within semiconductor substrate 100 to a first depth $d_1$. First impurity region 134 extends laterally to approximately the boundary 121 between channel region 102 and source/drain region 104b.

Turning now to FIG. 4, spacer support structure 110 is removed to unmask the first source/drain region 104a of semiconductor substrate 100 prior to the introduction of a second impurity distribution 146 which serves, in the depicted embodiment, as the lightly doped impurity distribution. The removal of spacer support structure 110 in an embodiment in which spacer support structure 110 comprises oxide may require a masking step to form a photoresist layer over gate dielectric 106 during the process employed to remove spacer support structure 110. In the preferred embodiment, second impurity distribution 146 is introduced into second impurity region 148 using a second ion implantation 144 carried out preferably using a boron, phosphorous, or arsenic implant species, an implant dose of less than approximately $2 \times 10^{14}$ atoms/cm$^2$, and an implant energy in the range of approximately 10 to 50 keV. Second impurity region 148 extends to a second impurity depth $d_2$ within semiconductor substrate 100. The second impurity depth $d_2$ is preferably less than or equal to first impurity depth $d_1$ and a peak concentration of second impurity distribution 146 is less than a peak concentration of first impurity distribution 132. Accordingly, second impurity distribution 146 is effectively shadowed or masked by first impurity distribution 132 within second source/drain region 104b of semiconductor substrate 100. In other words, the greater impurity concentration of first impurity distribution 132 substantially masks the presence of second impurity distribution 146. Accordingly, second impurity region 148b within first source/drain region 104a is shown in dashed lines in FIG. 4 and is eliminated completely from FIG. 5.

Turning now to FIG. 5, a pair of second spacer structures 150a and 150b is shown as fabricated on respective sidewalls 116 and 118 of first spacer structure 114. The pair of second spacer structures 150a and 150b will serve in the present invention in the more conventional role associated with spacer structures, namely: the formation of lightly doped drain transistors. In other words, the pair of second spacer structures 150a and 150b forms a localized mask over regions 152a and 152b of semiconductor substrate 100 proximal to channel region 102. By masking the proximal regions 152a and 152b, the pair of second spacer structures 150a and 150b effectively displace a subsequently introduced heavily doped impurity distribution from the transistor channel region in an effort to reduce the short channel effects described with respect to FIG. 3. In the presently preferred embodiment, the pair of second spacer structures 150 comprises a dielectric such as a CVD oxide. In the preferred embodiment, the pair of second spacer structures 150 are fabricated by depositing a conformal film on a topography defined by upper surfaces of semiconductor substrate 101 and first spacer structure 114. The resulting conformal film includes planar regions which are substantially planar to upper surface 101 of semiconductor substrate 100 in a manner similar to the conformal film associated with the fabrication of first spacer structure 114. Subsequent to the deposition of the conformal film, an appropriate etch is performed to remove the portions of the conformal film from the planar regions of the topography. In a presently preferred embodiment, the deposition of the conformal film includes reacting silicon and oxygen in a chemical vapor deposition reactor chamber maintained at a temperature in the range of approximately 200° C. to 750° C. and a pressure of less than two torr to deposit a conformal oxide film. Suitable reactants include silane and oxygen or, in another embodiment, tetraethyl orthosilicate (TEOS). Subsequent to the formation of the pair of second spacer structures 150, a third impurity distribution 156 is introduced into semiconductor substrate 100. A preferred method of achieving third impurity distribution 156 is a third ion implantation 154 preferably carried out using an implant dose of greater than approximately $10^{15}$ atoms/cm$^2$ using an implant energy in the range of approximately 10 to 100 keV. Third impurity distribution 156 is substantially contained within a third impurity region 158 which extends vertically to a third depth $d_3$ below upper surface 101 of semiconductor substrate 100. In the preferred embodiment, the third depth $d_3$ is greater than the second depth $d_2$ and the first depth $d_1$. Due to the presence of the pair of second spacer structures 150 during third ion implantation 154, third impurity distribution region 158 extends laterally to boundaries 153a and 153b respectively. Boundaries 153a and 153b are laterally displaced from boundaries 121 and 120 such that the third impurity distribution region 158 does not extend to channel region 102.

Figure 6:
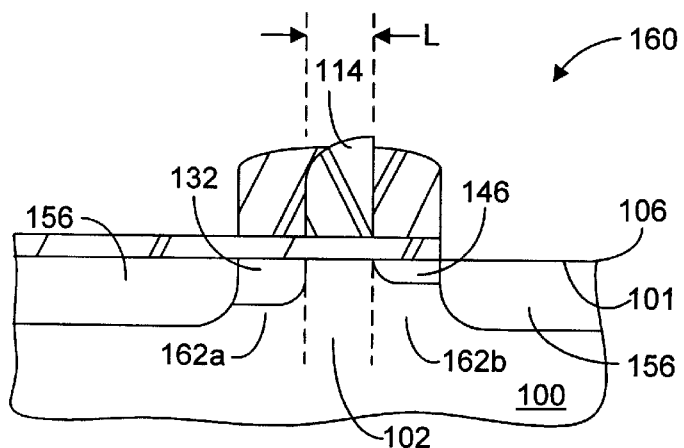
FIG. 6 is a partial cross-sectional view of a transistor including a spacer structure gate terminal fabricated according to the present invention.

Turning now to FIG. 6, transistor 160 is shown in accordance with the present invention. Transistor 160 includes a semiconductor substrate 100, a gate dielectric 106 formed on an upper surface 101 of semiconductor substrate 100, a gate terminal 114 formed on an upper surface of gate dielectric 106 over a channel region 102 of semiconductor substrate 100. Gate terminal 114 comprises a spacer structure. Transistor 160 further includes a source impurity distribution 162 and a drain impurity distribution 162a which are laterally displaced on either side of channel region 102. In the particular embodiment shown in FIG. 6, drain impurity distribution 162a includes a first impurity distribution 132 and a third impurity distribution 156 while source impurity distribution 162b includes a second impurity distribution 146 and a third impurity distribution 156 all as described in greater detail with respect to FIGS. 3 through 5. As indicated, gate terminal 114 comprises a spacer structure. For purposes of this disclosure, a spacer structure is defined as a structure formed on a sidewall of an existing feature such that the critical dimension of the spacer structure is controlled by the combination of a deposition and etch process rather than by a photolithographic process. In a presently preferred embodiment, a lateral dimension L of gate terminal 114 is in the range of approximately 400 to 2000 angstroms. Spacer structures with these dimensions can be reliably fabricated using existing chemical vapor deposition and etch techniques as will be appreciated to those skilled in the field of semiconductor processing.

It will be appreciated to those skilled in the art that the present invention contemplates the fabrication of an integrated circuit including a gate structure that comprises a spacer structure such that the critical dimension of the gate structure is defined by the spacer deposition process rather than by a lithographic process. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A process for forming a semiconductor device, comprising:

providing a semiconductor substrate, wherein said semiconductor substrate includes a channel region laterally displaced between source and drain regions;

forming a gate dielectric on an upper surface of said semiconductor substrate;

forming a spacer support structure on an upper surface of said gate dielectric, wherein said spacer support structure includes a substantially vertical sidewall laterally aligned over a boundary between said drain region and said channel region and wherein said spacer support structure masks said drain region of said semiconductor substrate;

fabricating a transistor gate by forming a first spacer structure on said sidewall of said spacer support structure, wherein said first spacer structure includes a substantially vertical first sidewall in contact with the spacer support structure, and further wherein said first spacer structure includes a second sidewall, wherein said second sidewall is laterally aligned over a boundary between said channel region and said source region whereby said first spacer structure masks said channel region;

introducing a first impurity distribution into said source region, wherein said first impurity distribution is characterized by a first impurity depth and a first peak impurity concentration, and wherein said first spacer structure and said spacer support structure effectively prevent said first impurity distribution from entering said channel region and said drain region;

removing said spacer support structure to unmask said drain region of said semiconductor substrate;

introducing a second impurity distribution into said source and drain regions of said semiconductor substrate, wherein said second impurity distribution is characterized by a second peak impurity concentration and a second impurity depth, and wherein said second peak impurity concentration is less than said first peak impurity concentration;

forming a pair of second spacer structures on said first and second sidewalls of said first spacer structure wherein said pair of second spacer structures masks portions of said source and drain regions proximal to said channel region; and introducing a third impurity distribution into said semiconductor substrate in the presence of said first spacer structure and said pair of second spacer structures, wherein the presence of said pair of second spacer structures effectively prevents said third impurity distribution from entering said proximal portions of said source and drain regions, and wherein said third impurity distribution is characterized by a third peak impurity concentration and a third impurity depth, wherein said third peak impurity concentration is greater than said second peak impurity concentration.

2. The process of claim 1, wherein providing said semiconductor substrate comprises providing a silicon wafer comprising a p-type epitaxial layer formed on a p+ silicon bulk.

3. The process of claim 1, wherein forming said gate dielectric comprises growing a thermal oxide film by immersing said semiconductor substrate in an oxygen bearing ambient maintained at a temperature in the range of approximately 500 to 800° C.

4. The process of claim 1, wherein said spacer support structure comprises photoresist.

5. The process of claim 1, wherein said spacer support structure comprises oxide.

6. The process of claim 1, wherein forming said first spacer structure comprises depositing a first conformal film over a topography comprising upper surfaces of said semiconductor substrate and said spacer support structure, said topography including planar regions substantially parallel with said upper surface of said semiconductor substrate;

anisotropically etching said first conformal film for a duration sufficient to substantially remove said first conformal film from said planar regions of said topography without removing said first conformal film from remaining portions of said topography.

7. The process of claim 6, wherein depositing said first conformal film comprises depositing polysilicon by thermally decomposing silane in a chemical vapor deposition reactor chamber maintained at a temperature in the range of approximately 580 to 650° C. and a pressure of less than approximately 2 torr.

8. The process of claim 7, further comprising, subsequent to depositing said polysilicon and prior to anisotropically etching, introducing an impurity concentration into said polysilicon to reduce a sheet resistivity of said polysilicon to less than approximately 500 Ω/square.

9. The process of claim 6, wherein depositing said first conformal film comprises depositing a conductive material selected from the group comprising silicon, aluminum, tungsten, and copper.

10. The process of claim 1, wherein introducing said first impurity distribution comprises implanting ions selected from the group consisting of boron, arsenic, and phosphorous and further wherein an implant energy used for said first impurity distribution is in the range of approximately 10 to 50 keV and an implant dose is in the range of approximately $2 \times 10^{14}$ to $1 \times 10^{15}$ atoms/cm$^2$.

11. The process of claim 1, wherein introducing said second impurity distribution comprises implanting ions selected from the group consisting of boron, arsenic, and phosphorous and further wherein an implant energy used for said second impurity distribution is in the range of approximately 10 to 50 keV and an implant dose is less than approximately $2 \times 10^{14}$ atoms/cm$^2$.

12. The process of claim 1, wherein forming said pair of second spacer structures comprises depositing a second conformal film over a topography comprising upper surfaces of said semiconductor substrate and said first spacer structure, wherein said topography includes planar regions substantially parallel with said upper surface of said semiconductor substrate;

anisotropically etching said second conformal film for a duration sufficient to substantially remove said second conformal film from said planar regions of said topography without removing said second conformal film from remaining portions of said topography.

13. The process of claim 12, wherein depositing said second conformal film comprises reacting oxygen and silicon in a chemical vapor deposition chamber reactor maintained at a temperature in the range of approximately 200 to 750° C. and a pressure of less than approximately 2 torr.

14. The process of claim 1, wherein introducing said third impurity distribution comprises implanting ions selected from the group consisting of boron, arsenic, and phosphorous and further wherein an implant energy used for said third impurity distribution is in the range of approximately 10 to 100 keV and an implant dose is greater than approximately $1 \times 10^{15}$ atoms/cm$^2$.

15. The process of claim 1, wherein a thickness of said first conformal film in said planar regions is in the range of approximately 500 to 2000 angstroms whereby a lateral dimension of said first spacer structure is in the range of approximately 400 to 2000 angstroms.

16. A process for fabricating a semiconductor transistor comprising a gate terminal, and source and drain regions laterally displaced within a semiconductor substrate on either side of a channel region of said semiconductor substrate; said process comprising:

providing said semiconductor substrate;

forming a gate dielectric on an upper surface of said semiconductor substrate;

forming a spacer support structure on said gate dielectric;

fabricating said gate terminal on an upper surface of said gate dielectric by forming a first spacer structure on a sidewall of said spacer support structure, wherein said gate terminal is aligned over a channel region of said semiconductor substrate;

introducing first impurity distribution into said semiconductor substrate using said first spacer and spacer support structures as a mask;

removing said spacer support structure; and introducing a second impurity distribution into said semiconductor substrate using said first spacer structure as a mask.

17. The process of claim 16, wherein forming said gate dielectric comprises growing a thermal oxide film by immersing said semiconductor substrate in an oxygen bearing ambient maintained at a temperature in the range of approximately 500 to 800° C.

18. The process of claim 16, wherein said spacer support structure comprises photoresist.

19. The process of claim 16, wherein said spacer support structure comprises oxide.

20. The process of claim 16, wherein forming said first spacer structure comprises depositing a conformal film over a topography comprising upper surfaces of said semiconductor substrate and said spacer support structure, said topography including planar regions substantially parallel with said upper surface of said semiconductor substrate;

anisotropically etching said conformal film for a duration sufficient to substantially remove said conformal film from said planar regions of said topography without removing said conformal film from remaining portions of said topography.

21. The process of claim 16, further comprising forming a pair of second spacer structures on sidewalls of said first spacer structure; and introducing a third impurity distribution into said semiconductor substrate, using said first spacer structure and said pair of second spacer structures as a mask.

* * * * *